United States Patent
Amidi et al.

(10) Patent No.: US 7,724,604 B2
(45) Date of Patent: May 25, 2010

(54) CLOCK AND POWER FAULT DETECTION FOR MEMORY MODULES

(75) Inventors: Mike H. Amidi, Lake Forest, CA (US); Satyadev Kolli, Milpitas, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 702 days.

(21) Appl. No.: 11/552,949

(22) Filed: Oct. 25, 2006

(65) Prior Publication Data

US 2008/0101147 A1     May 1, 2008

(51) Int. Cl.
*G11C 5/14* (2006.01)

(52) U.S. Cl. .......................... 365/229; 365/51; 365/226; 365/233.11; 711/115; 711/154

(58) Field of Classification Search ................ 365/228, 365/229, 51, 52, 226, 233.1, 233.11; 711/105, 711/115, 154
See application file for complete search history.

(56) References Cited

U.S. PATENT DOCUMENTS

| | | | | |
|---|---|---|---|---|
| 4,383,184 A | * | 5/1983 | McFarland | 307/66 |
| 5,495,435 A | * | 2/1996 | Sugahara | 365/52 |
| 5,798,961 A | * | 8/1998 | Heyden et al. | 365/52 |
| 7,139,937 B1 | * | 11/2006 | Kilbourne et al. | 714/47 |
| 7,143,298 B2 | * | 11/2006 | Wells et al. | 713/300 |
| 7,224,595 B2 | * | 5/2007 | Dreps et al. | 365/63 |
| 2006/0117152 A1 | * | 6/2006 | Amidi et al. | 711/154 |

* cited by examiner

*Primary Examiner*—Dang T Nguyen
*Assistant Examiner*—Alexander Sofocleous
(74) *Attorney, Agent, or Firm*—Perkins Coie LLP

(57) ABSTRACT

A system, method and apparatus for clock and power fault detection for a memory module is provided. In one embodiment, a system is provided. The system includes a voltage detection circuit and a clock detection circuit. The system further includes a controller coupled to the voltage detection circuit and the clock detection circuit. The system also includes a memory control state machine coupled to the controller. The system includes volatile memory coupled to the memory control state machine. The system further includes a battery and battery regulation circuitry coupled to the controller and the memory control state machine. The battery, battery regulation circuitry, volatile memory, memory control state machine, controller, clock detection circuit and voltage detection circuit are all collectively included in a unitary memory module.

22 Claims, 15 Drawing Sheets

CLOCK AND POWER FAULT DETECTION FOR MEMORY MODULES

BACKGROUND

Computer systems operate in part using volatile memory. Memory modules with Random Access Memory typically will not retain any data when power is not supplied. Such memory modules require power to maintain values which are stored in memory cells, and may also require periodic refresh of contents of memory cells. This differs from non-volatile memory such as various forms of Read Only Memory or other memory such as magnetic or optical memory. However, whereas non-volatile memory tends to have long-term storage capacity, it also tends to be slower, with read-only memory of various types often copied into volatile random access memory during operation of computers and similar machines.

As systems become more mission critical, the possibility of irreplaceable data being stored in volatile memory increases. Similarly, failure analysis can be much simpler if information about the state of a system is available after a failure occurs. Moreover, some data may be useful for restarting a system after a failure, even though that information is not otherwise vital for external purposes. Also, some data may simply be desirable for retention purposes, but may also be most useful in volatile memory.

Thus, it may be useful to provide an option for keeping data in volatile memory even when a surrounding system loses power. Moreover, it may also be useful to keep data in volatile memory when a surrounding system suffers some form of an error which causes a clock to malfunction even though power is still supplied. Likewise, it may be useful to provide volatile memory which has non-volatile characteristics in short- or medium-term time periods.

BRIEF DESCRIPTION OF THE DRAWINGS

The present invention is illustrated by way of example in the accompanying drawings. The drawings should be understood as illustrative rather than limiting.

DETAILED DESCRIPTION

Figure 1:
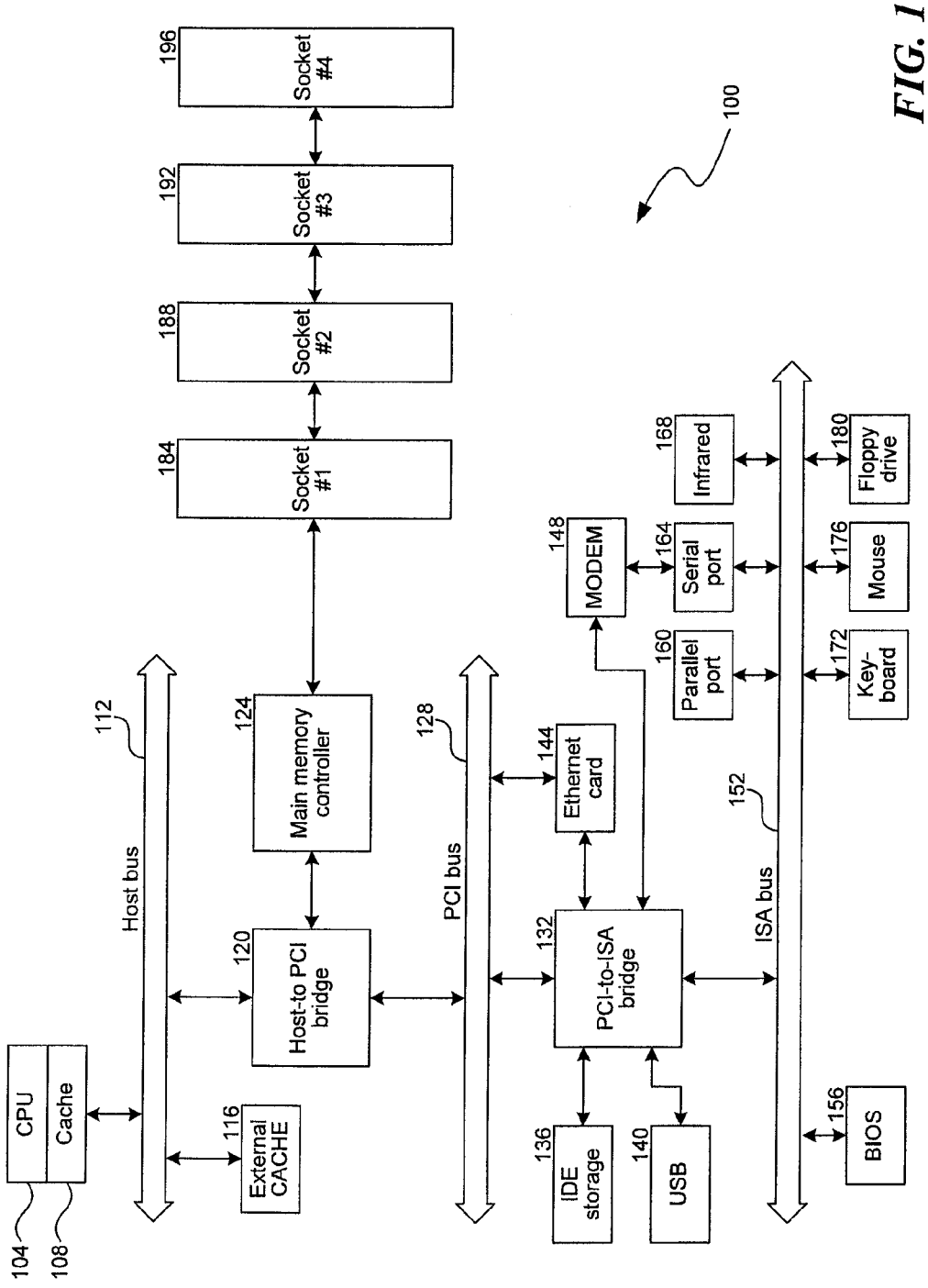
FIG. 1 illustrates an embodiment of a computer.

A system, method and apparatus is provided for a clock and power fault detection for a memory module. The specific embodiments described in this document represent examples or embodiments of the present invention, and are illustrative in nature rather than restrictive.

Clock and power fault detection for a memory module may be provided in a variety of ways. For example, one may provide a system with a controller which detects voltage levels and clock signals, a state machine for operating a memory in backup mode, and a battery and supporting circuitry for supplying backup power. Similarly, one may provide a process which operates to detect voltage and clock signals, initiate backup operations, maintain memory (through refresh, for example), and detect a recovery status. Providing such a system or process within a memory module can be very helpful, as it avoids the need for system circuitry in a computer system or similar device which can maintain a memory module from outside the module. Moreover, such a system or process may be tuned to the specific memory module, instead of requiring overhead to deal with many different types of memory modules, for example.

In one embodiment, a system is provided. The system includes a voltage detection circuit and a clock detection circuit. The system further includes a controller coupled to the voltage detection circuit and the clock detection circuit. The system also includes a memory control state machine coupled to the controller. The system includes volatile memory coupled to the memory control state machine. The system further includes a battery and battery regulation circuitry coupled to the controller and the memory control state machine. The battery, battery regulation circuitry, volatile memory, memory control state machine, controller, clock detection circuit and voltage detection circuit are all collectively included in a unitary memory module.

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Features and aspects of various embodiments may be integrated into other embodiments, and embodiments illustrated in this document may be implemented without all of the features or aspects illustrated or described.

FIG. 1 illustrates an embodiment of a computer. Computer 100 is a machine which includes some of the elements typically found in various types of computers, such as desktop or laptop computers, personal digital assistants, or server computers, for example. Not shown are some common subsystems, such as a graphics accelerator or other video subsystem, for example.

Computer 100 includes a processor 104 (such as a central processing unit) with a cache 108 coupled thereto. Host bus 112 provides for an interface between processor 104 and components such as external cache 116, host-to-PCI bridge 120 and other similar components. External cache 116 may provide for additional caching resources, such as a level two cache, for example. Host-to-PCI bridge 120 may provide a bridge to a PCI bus 128, and may also provide a datapath to a memory controller 124, for example. Thus, bridge 120 may serve as a memory hub, for example. Memory controller 124 controls access to memory modules in sockets 184, 188, 192 and 196.

PCI bus 128 provides an interface with still more components of the computer 100. Coupled to PCI bus 128 are PCI-to-ISA bridge 132 and Ethernet card 144. Bridge 132 provides a bus bridge to ISA bus 152, and provides a datapath to components such as IDE storage subsystem 136 and USB interface 140, along with Ethernet card 144 and modem 148. ISA bus 152 provides a datapath to BIOS 156, parallel port 160, serial port 164, infrared port 168, keyboard 172, mouse 176 and floppy drive 180. As one may expect, other components may be included and many of the components illustrated (such as the floppy disk 180 for example) may be omitted from some embodiments.

Figure 2:
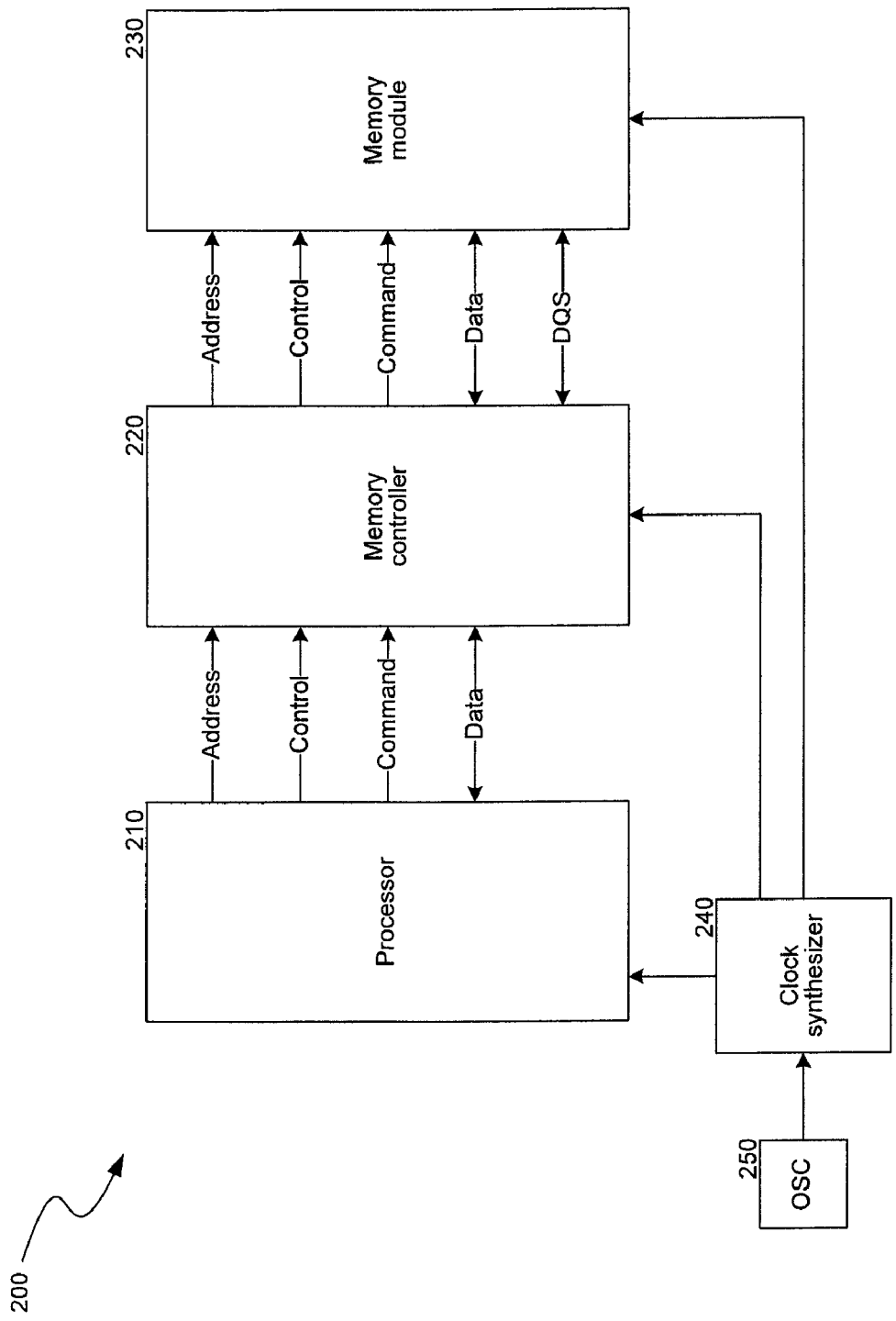
FIG. 2 illustrates an embodiment of a memory interface in a computer.

Memory sockets such as sockets 184, 188, 192 and 196 may be populated with various types of memory modules. FIG. 2 illustrates an embodiment of a memory interface in a computer. The memory interface 200 provides for communication between a processor 210 and a memory module 230. Processor 210 provides control signals and (potentially) data to memory controller 220. Controller 220 then provides control signals to memory module 230. Thus, controller 220 handles the sometimes complicated process of signaling module 230, providing address, control and command signals at the right times for the memory module 230, and either providing or receiving data and DQS signals as necessary. Similar address, control and command signals are provided by the processor 210 to the controller 220, but may not be provided with the timing required for module 230. In synchronous systems, oscillator 250 and clock synthesizer 240 provide clock signals to the various components.

Figure 3:
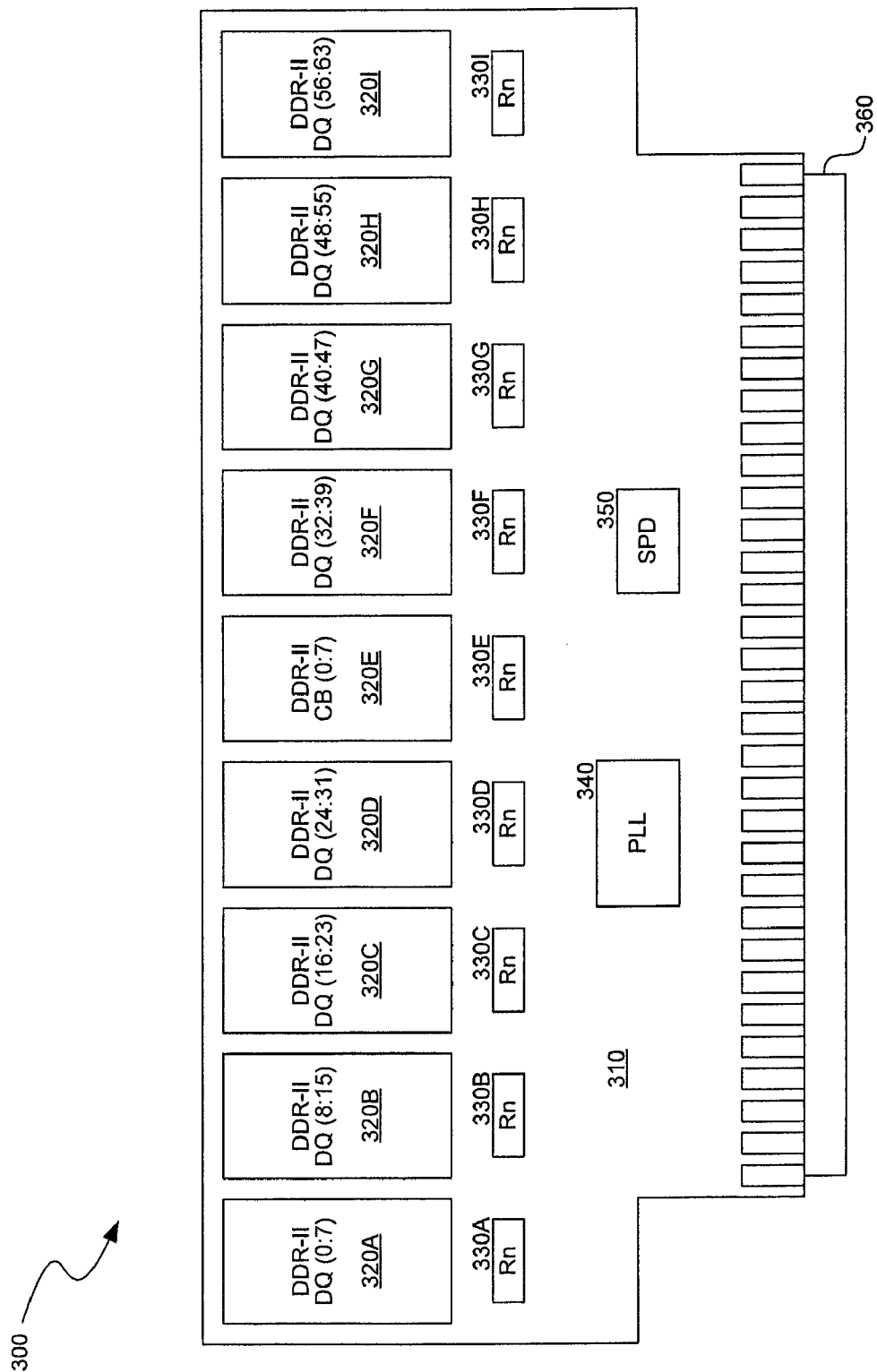
FIG. 3 illustrates an embodiment of a top side of an unbuffered clocked memory module.

With a memory system in place, a memory module must be supplied as part of the system. FIG. 3 illustrates an embodiment of a top side of an unbuffered clocked memory module. Memory in general is typically SDRAM—synchronous dynamic random access memory, which is volatile. If a memory system gets interrupted too much, the data stored in SDRAM can be lost. Thus, memory module 300 may be used as part of a system which maintains some of the data in SDRAM.

In one embodiment, memory module 300 includes a memory card (e.g. a printed circuit board), memory chips, series termination resistors, PLL (Phase-Lock-Loop) and SPD (Serial Presence Detect) components, and a card interface. Memory card 310 provides the base for the memory module 300, and provides traces for conductivity between components. Mounted on memory card 310 are memory chips 320 (320A-I as illustrated) and resistors 330 (330A-I as illustrated). Also provided are a PLL 340 and an SPD module 350. Furthermore, some of the traces or conductors of memory card 310 connect to card interface 360, a set of printed conductors on an edge of the card which may mate with a slot or socket on a card to which memory module 300 is connected. Thus, the front side of memory card 310 basically includes the memory components.

Figure 4:
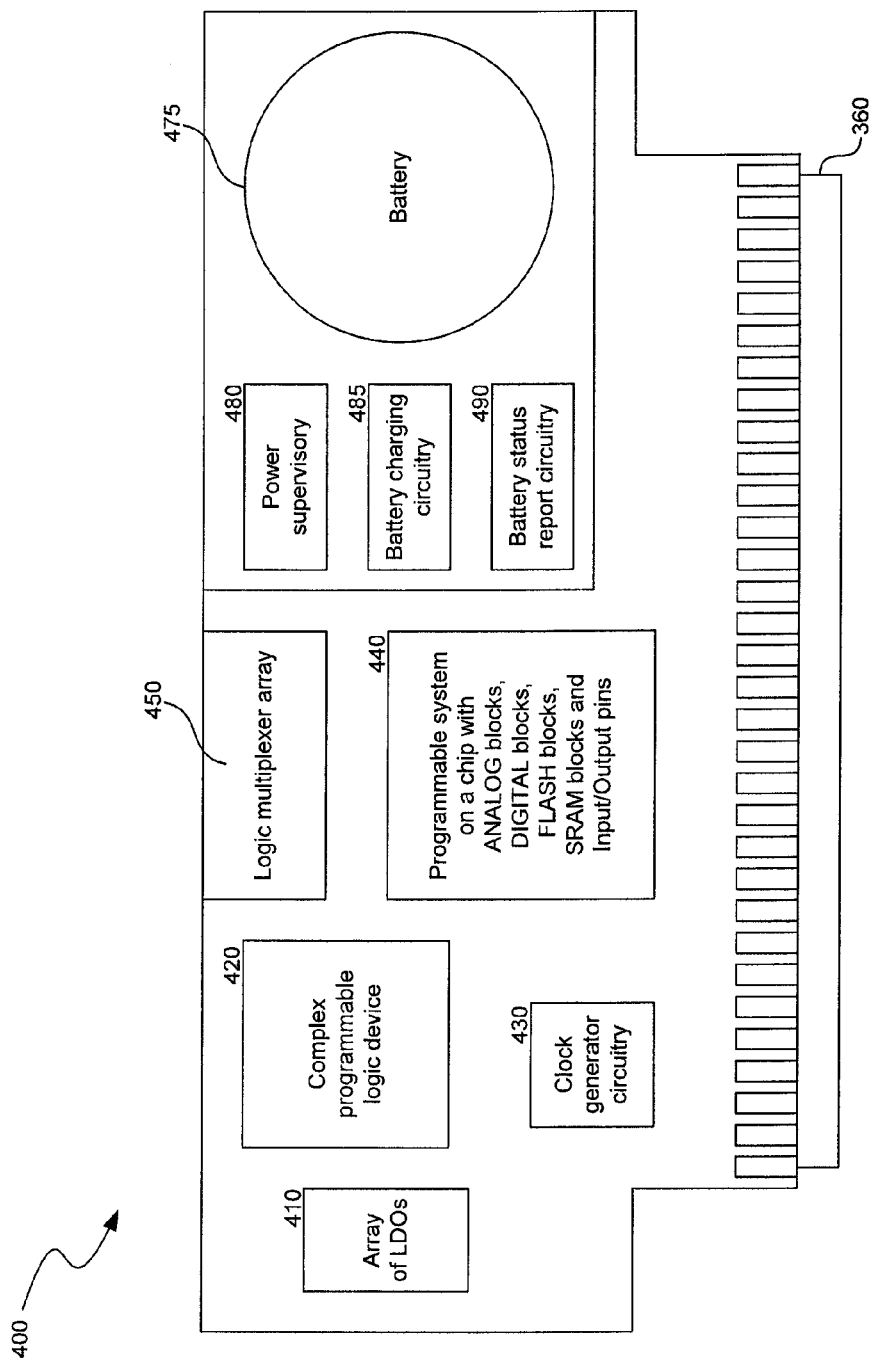
FIG. 4 illustrates an embodiment of a back or bottom side of an unbuffered clocked memory module.

The back side of memory card 310 may contain other components. FIG. 4 illustrates an embodiment of a back or bottom side of an unbuffered clocked memory module. The module is provided with clock and power fault detection capabilities. Card interface 360 is present on this side as well, providing connectivity. Also included is an array of LDOs 410, providing power regulation, a CPLD (Complex Programmable Logic Device) 420, providing logic such as a state machine, a battery module 470, a logic signal multiplexer array 450, providing switching capabilities for logic signals, a processor 440, providing a processor system on a chip, and a clock generator module 430, providing clock signals. Battery module 470 includes a battery 475, power supervisory module 480, battery charging circuitry 485 and battery status circuitry 490. Where it seems apparent that further description is needed, embodiments of these components are illustrated and described below.

Figure 5:
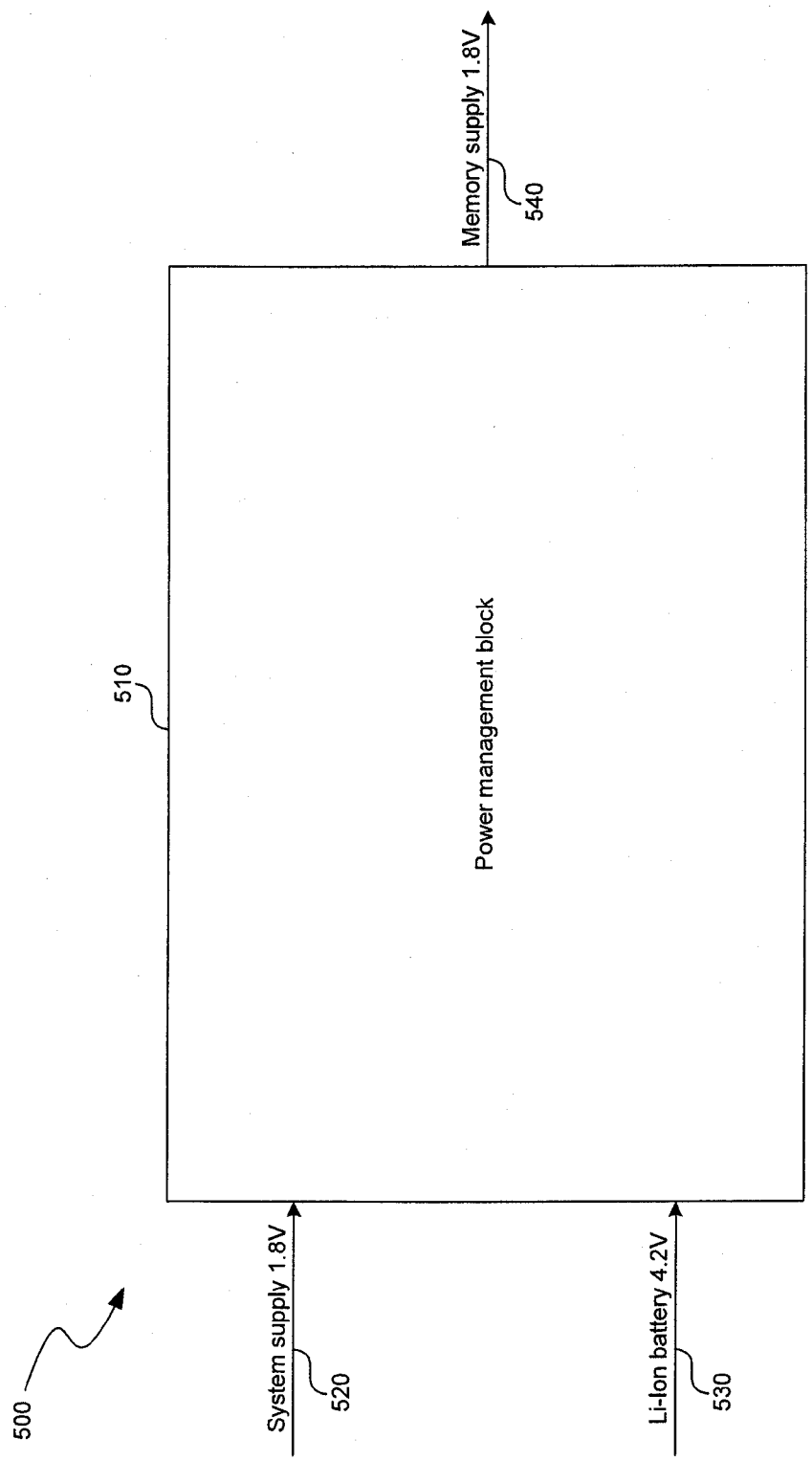
FIG. 5 illustrates an embodiment of a power management block.

Part of a memory module is typically a power management block. FIG. 5 illustrates an embodiment of a power management block. Power management block 500 includes the actual power management module 510, an incoming system supply 520, an incoming battery supply 530, and an outgoing memory power supply 540. Power management block 500 may thus be used to attempt to ensure a stable power supply even in the face of disruptions in system supply 520, for example.

Figure 6:
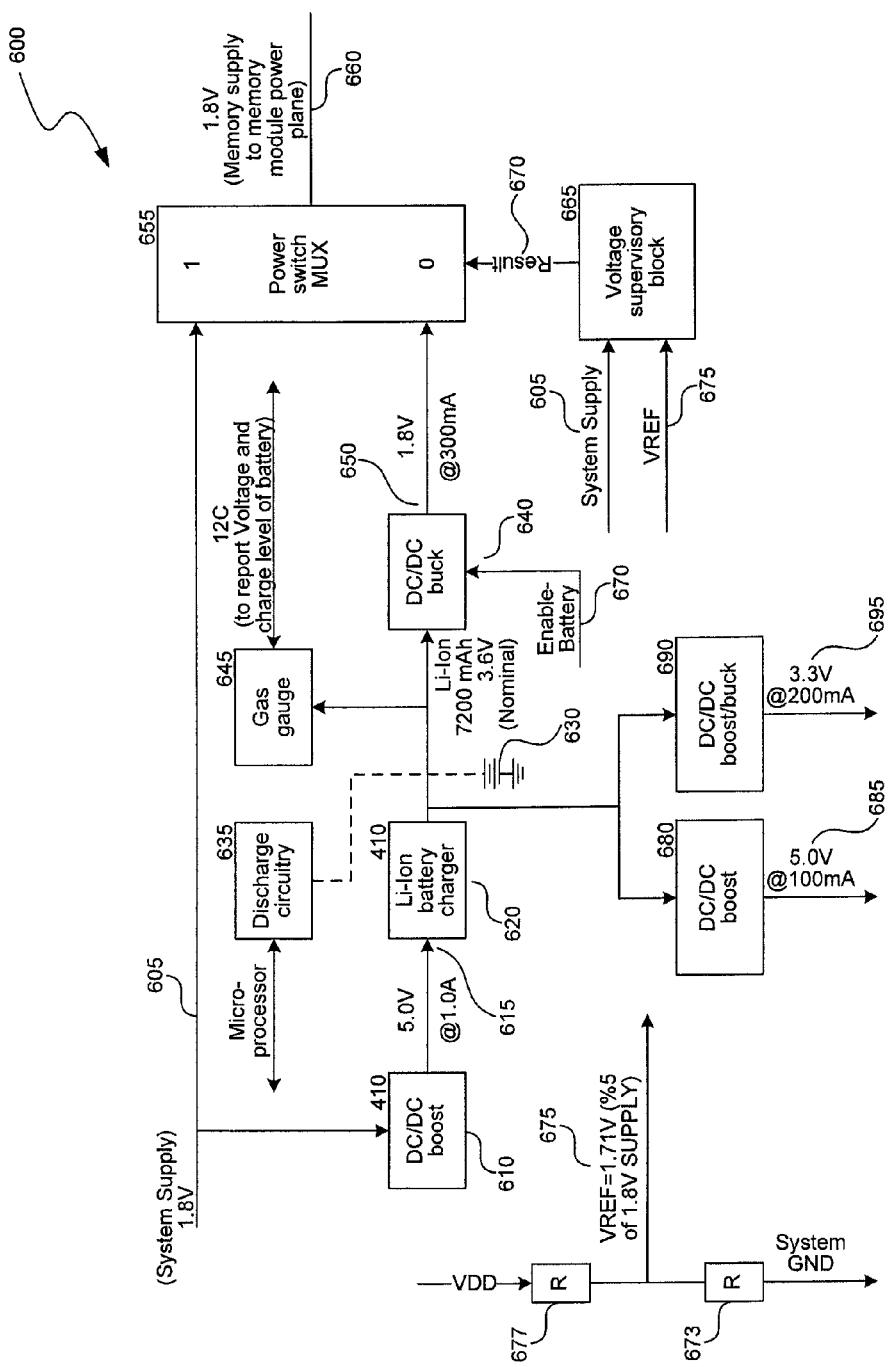
FIG. 6 illustrates an embodiment of the internals of a power management block.

While a power management block 500 may be implemented in a variety of ways, power management block 600 provides one example of such an implementation. FIG. 6 illustrates an embodiment of the internals of a power management block. System supply 605 provides a system power supply to a boost power converter 610 and a power switch multiplexer 655.

Boost converter 610 provides a power output 615 which powers battery charger 620—which in turn supplies battery 630. If necessary, discharge circuitry 635 can discharge battery 630 on a command from a microprocessor. Moreover, gas gauge 645 can interpret battery output 625 to determine a rough charge status of battery 630. Additionally, battery output 625 is provided to boost converter 680 to produce power supply 685 and boost/buck converter 690 to produce power supply 695. Also, battery output 625 provides power to buck converter 640 (when enabled by battery enable signal 670) which produces battery power 650 as an input to power switch multiplexer 655. Thus, power switch multiplexer 655 may switch between battery power 650 and system supply 605 based on a signal 670.

Signal 670 is controlled by voltage supervisory block 665, which receives system supply 605 and a reference voltage 675, and compares the two. If system supply 605 has a greater magnitude than reference voltage 675, signal 670 causes power switch multiplexer 655 to choose system supply 605 as a source for memory supply 660. If system supply 605 has a magnitude lower than reference voltage 675, then signal 670 causes power switch multiplexer 655 to choose battery power 650 for memory supply 660. Reference voltage 675 is generated in one embodiment by a resistive voltage divider using resistors 677 and 673 in series between a voltage rail and ground.

Figure 7:
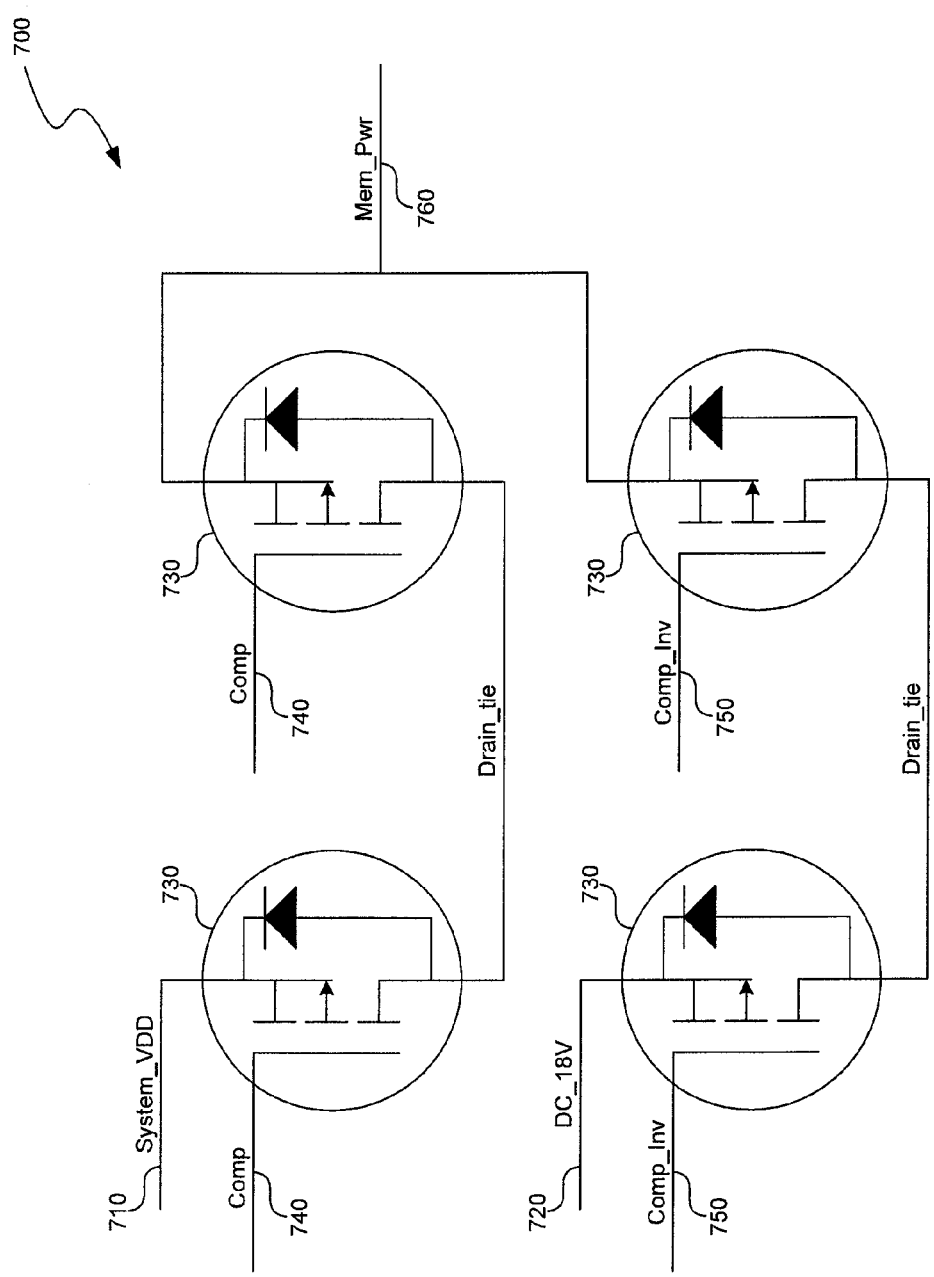
FIG. 7 illustrates an embodiment of a power switch multiplexer.

Power switch multiplexer 655 may be implemented in a number of different ways. Generally, multiplexers are well known. However, multiplexing a power signal output may involve concerns not commonly found in other multiplexing situations. FIG. 7 illustrates an embodiment of a power switch multiplexer. Multiplexer 700 uses a set of power transistors to provide conduction paths for the two input power supply signals.

System supply 710 is coupled to a first transistor 730, which in turn is coupled to a second transistor 730, which in turn is coupled to memory power output 760. The transistors 730 in the path from supply 710 to memory supply 760 are controlled by a comparison signal 740. Additionally, the transistors 730 in this path are coupled at the drain side of the transistors 730, so that the parasitic diodes formed by each transistor 730 in the path are opposed to each other—parasitic conduction for one transistor is blocked by a blocking path in the other transistor when the transistors are turned off. Thus, when the path between system supply 710 and memory supply 760 is shutoff, even parasitic conductance should be minimal or zero.

A similar conduction path is provided between battery supply 720 and memory supply 760. Two transistors 730 are drain coupled in the path from battery supply 720 to memory supply 760, and the transistors of this path are controlled by comparison inverse signal 750. Signal 740 and signal 750 are complements of each other, so conduction should only occur along one path in multiplexer 700 at any give time. Additionally, the opposing parasitic diodes of the transistors 730 in each conduction path should essentially block parasitic current when a given conduction path is turned off. Note that transistors 730 are described as power Metal-Oxide Semiconductor Field-Effect Transistor—MOSFETs (e.g. transistors 730 have drains), but other power transistors may be appropriate, provided that opposing parasitic components can be incorporated.

Figure 8:
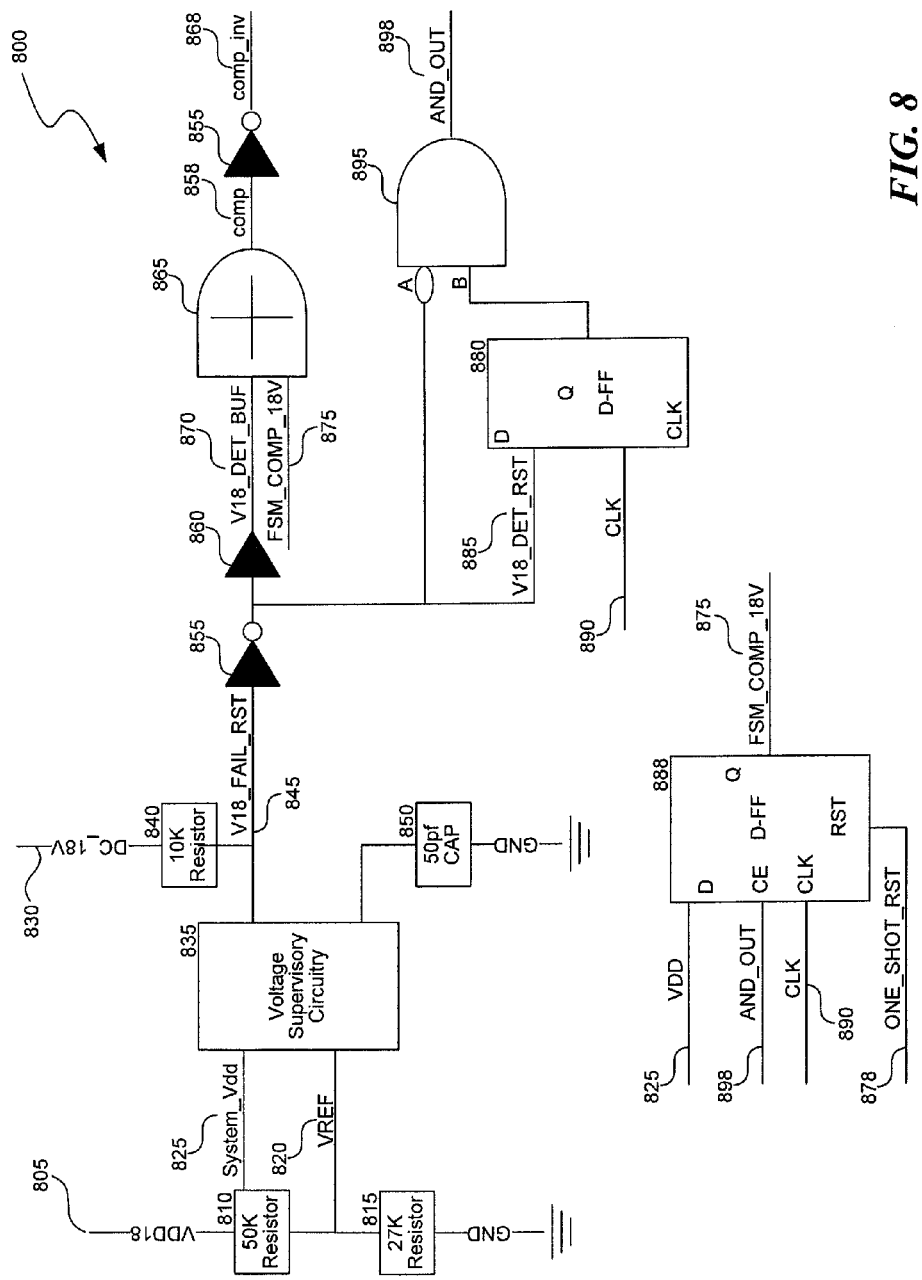
FIG. 8 illustrates an embodiment of a voltage supervisory system.

Much of the functions involved in managing power supply are handled by the voltage supervisory block of various embodiments. FIG. 8 illustrates an embodiment of a voltage supervisory system. While various embodiments may be used, voltage supervisory block 800 represents one embodiment which may be useful for providing power to a memory module. Voltage supervisory block 800 compares a system voltage with a reference voltage, and generates output signals with various logic components to control other parts of the power supply circuitry.

Voltage supervisory circuitry 835 compares a system power signal 825 with a voltage reference signal 820 and provides a power fail signal 845. Voltage reference signal 820 is produced from a voltage rail 805 and a resistive divider composed of a 50 kohm resistor 810 in series with a 27 kohm resistor 815 to ground. Presumably, voltage rail 805 is powered from a secure power supply such as a battery power supply. Voltage supervisory circuitry 835 also is coupled to ground through a capacitor 850.

The power fail signal 845 is pulled up to power rail 830 through resistor 840, and feeds into inverter 855. This produces a voltage detection reset signal 885, and feeds into a buffer 860 to produce a voltage detection buffered signal 870. OR gate 865 evaluates signal 870 and a finite state machine signal 875 to produce comparison signal 858 and through an inverter 855 to produce inverted comparison signal 868. Comparison signal 858 and inverted comparison signal 868 may be used as a logically paired set of signals to control a power multiplexer such as that of FIG. 7.

Voltage detection reset signal 885 is fed into flip-flop 880 which is clocked by clock signal 890. The output of flip-flop 880 is fed to AND gate 895 along with an inverted version of signal 885 to produce a pulse at output 898. AND output 898 is used as the chip enable signal to flip-flop 888, which is also clocked with clock signal 890 and uses a power supply signal 825 as an input to produce finite state machine signal 875. One-Shot reset signal 878 resets flip-flop 888, thereby clearing signal 875.

Figure 9:
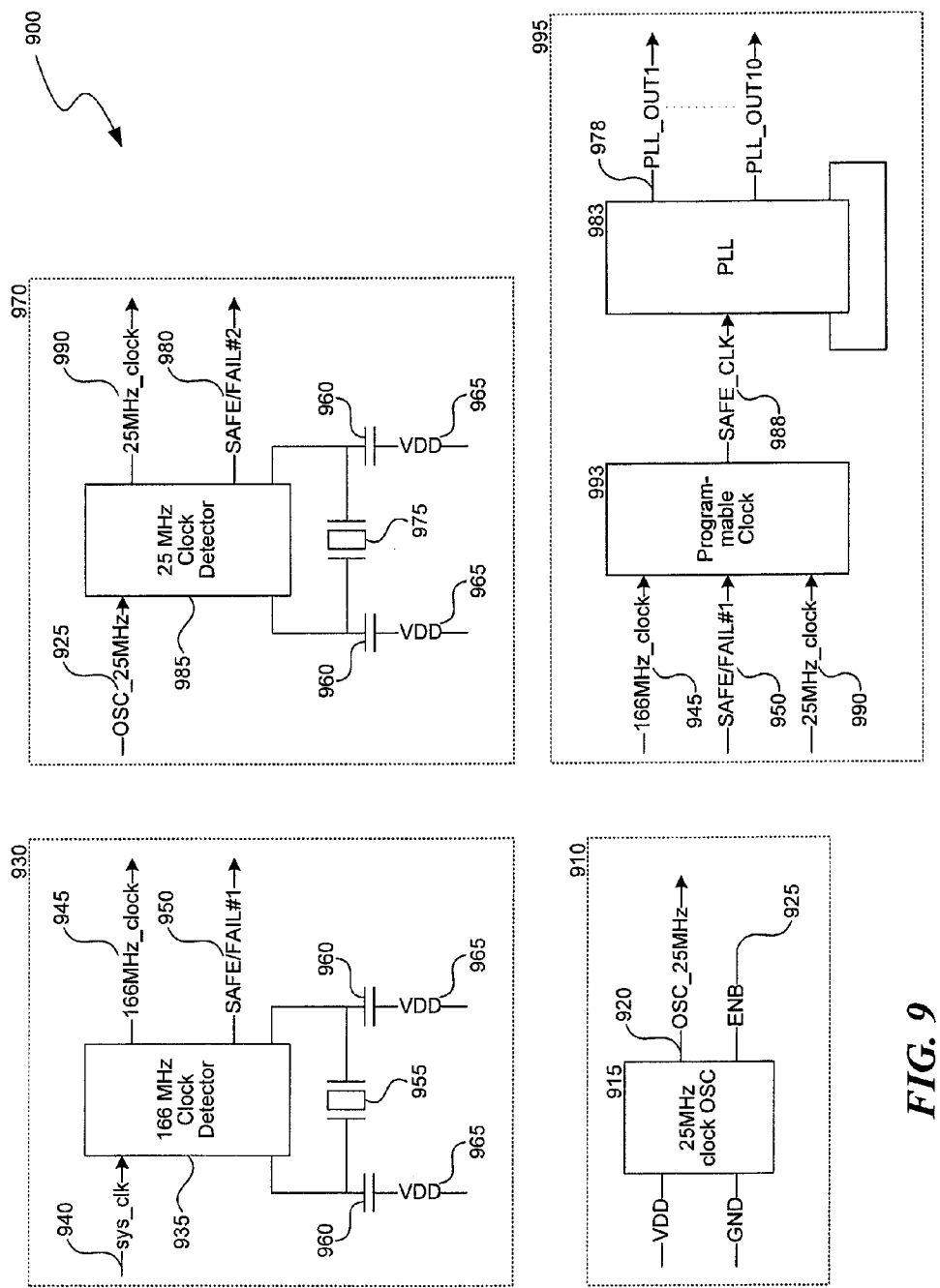
FIG. 9 illustrates an embodiment of clock circuitry.

While voltage supervisory circuitry provides signals to indicate what voltage signal should be supplied as a power source, clock circuitry may be needed in some systems to maintain synchronous operations, or just to drive periodic processes. FIG. 9 illustrates an embodiment of clock circuitry. Several different clock sub-circuits are illustrated. Circuit 910 uses a 25 MHz oscillator 915 which is enabled by enable 925 to produce a 25 MHz clock 920. Circuit 930 uses oscillator 955, coupled through capacitors 960 to voltage rail 965, to produce an oscillating signal which is used by clock detector 935 in detecting system clock 940, and thereby producing 166 MHz clock 945, along with a safe/fail signal 950. Similarly, circuit 970 uses oscillator 975, coupled through bypass capacitors 960 to power rail 965 with clock detector 985 to detect 25 MHz clock signal 925 and to produce 25 MHz clock 990 along with safe/fail signal 980. A safe clock signal is produced by circuit 995, using 166 MHz clock 945, 25 MHz clock 990 and safe/fail signal 950 to determine the output (safe clock 988) of programmable clock component 993. Safe clock 988 provides an input to phase locked loop 983, which produces PLL output signals 978 and uses a feedback loop to maintain a clock signal.

Figure 10:
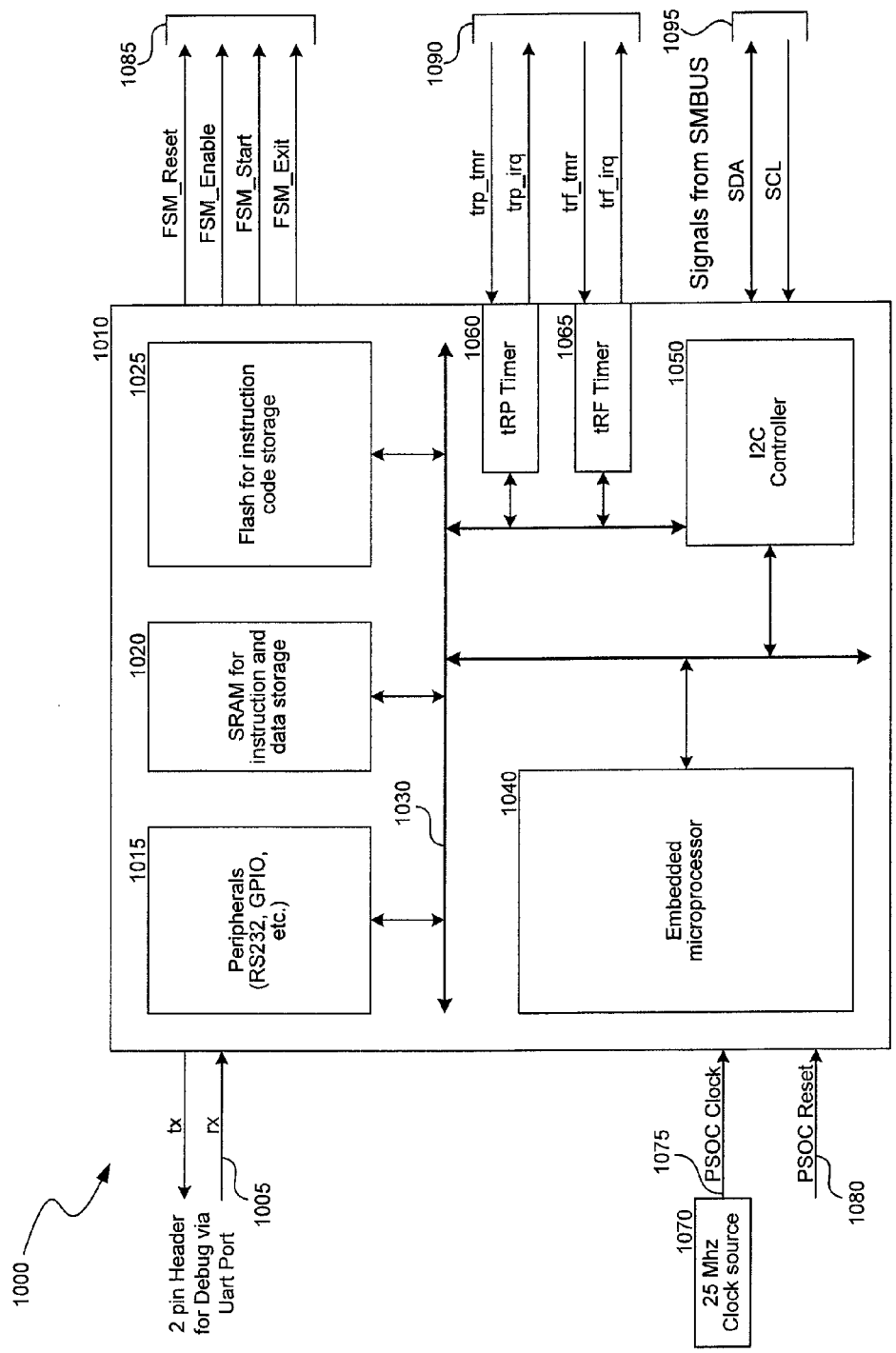
FIG. 10 illustrates an embodiment of a processor system on a chip.

A processor system on a chip may be used to provide various functionality, in particular generation of control signals for a finite state machine, for example. FIG. 10 illustrates an embodiment of a processor system on a chip. Processor system on a chip 1010 may be implemented as a Cypress processor system on a chip, or through other digital signal processors or similar devices.

A debug port 1005 is provided, a reset input 1080 is provided, and a clock generator 1070 provides a clock 1075. Internally, PSOC (Programmable System On a Chip) 1010 includes an embedded microprocessor module 1040, an I2C controller module 1050, peripheral interface 1015, local SRAM 1020, local FLASH ROM 1025, and two timers (TRP timer 1060 and TRF timer 1065), all of which are coupled through bus 1030. Processor module 1040 may be programmed to generate finite state machine control signals 1085, and to control timers 1060 and 1065 to generate timer signals 1090. Similarly, an interface with an SMBUS may be provided through signals 1095. Moreover, I2C controller 1050 allows for communication with a surrounding system. FLASH ROM 1025 may store code and SRAM 1020 may store local variables.

Figure 11:
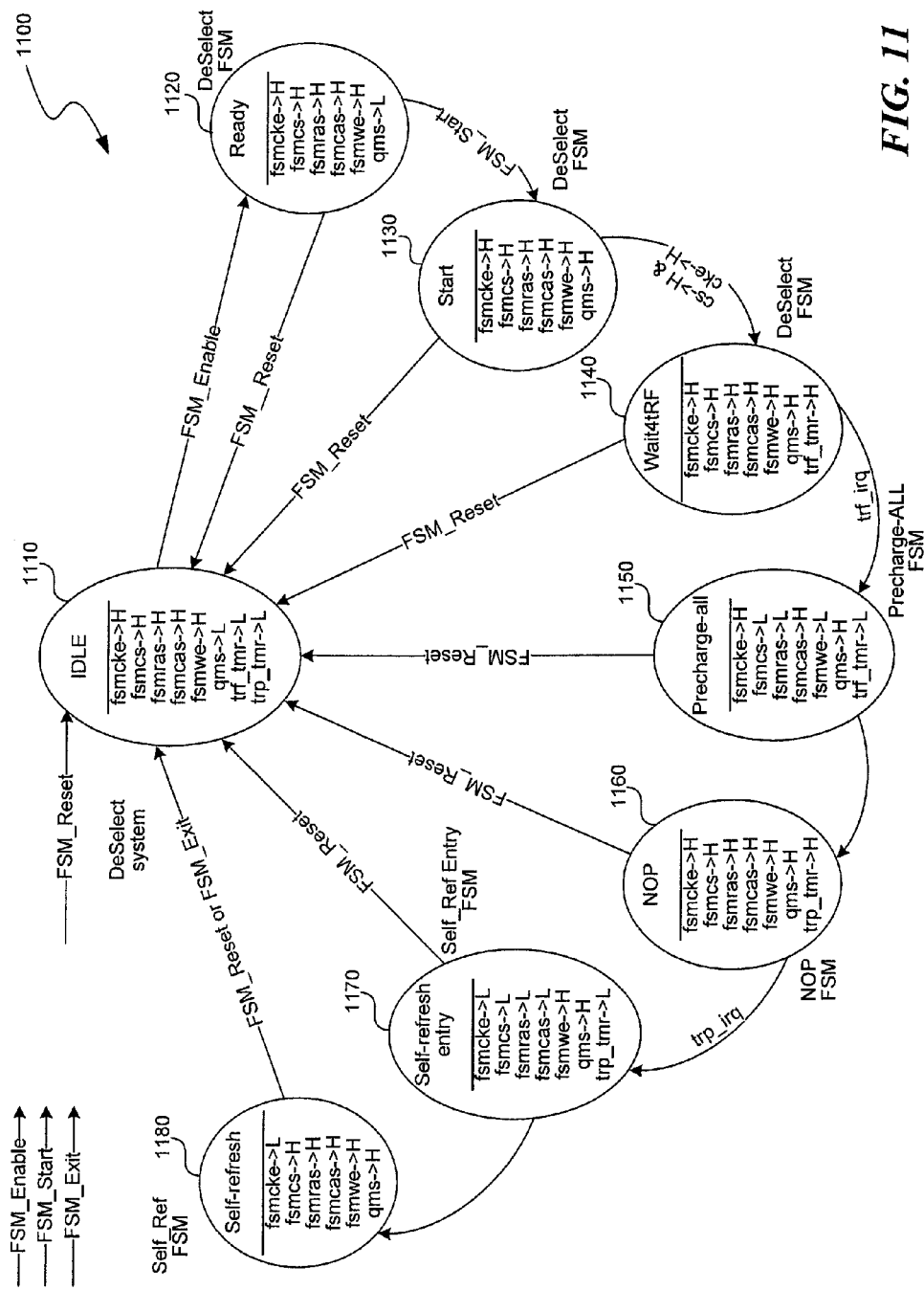
FIG. 11 illustrates an embodiment of a state machine.

Control of a state machine allows for a state machine to be implemented and operated, such as in a complex programmable logic device (e.g. a CPLD available from Xilinx). FIG. 11 illustrates an embodiment of a state machine. State machine 1100 may be used to refresh SDRAM of a memory module when the SDRAM is not otherwise the subject of operations in a normal system mode. Essentially, one may expect that SDRAM will be properly refreshed when system power is present and a system operates normally, but if SDRAM is to retain memory in a power fail situation, refresh operations must be implemented without benefit of other parts of a system, requiring that the memory module trigger SDRAM refresh operations itself.

State machine 1100 is initialized with a reset at idle state 1110. When a system powers on, for example, one may expect the reset signal to cause the state machine 1100 to move to idle state 1110. This avoids unexpected operation due to transient signals, for example. When the system is armed, the enable signal moves state machine 1100 into ready state 1120. From here, the system may await a start signal, at which point it moves to start state 1130. From start state 1130, the state machine 1100 advances to wait state 1140, based on chip select and clock enable signals being asserted. At wait state 1140, a trf timer (such as a timer of PSOC 1010) is started, and a signal from the trf timer results in an advance to precharge state 1150. From precharge state 1150, the state machine 1100 advances automatically to another wait state 1160, with a trp timer (such as another timer of PSOC 1010) started. A signal from the trp timer advances the state machine 1100 to self-refresh entry state 1170, with self-refresh initiated for the memory module. The state machine then advances automatically to self refresh state 1180, and stays there automatically self-refreshing the memory module. A reset signal or an exit signal will move the state machine 1100 back to idle state 1110, ending the self-refresh process, such as when a system sufficiently recovers power.

Figure 12:
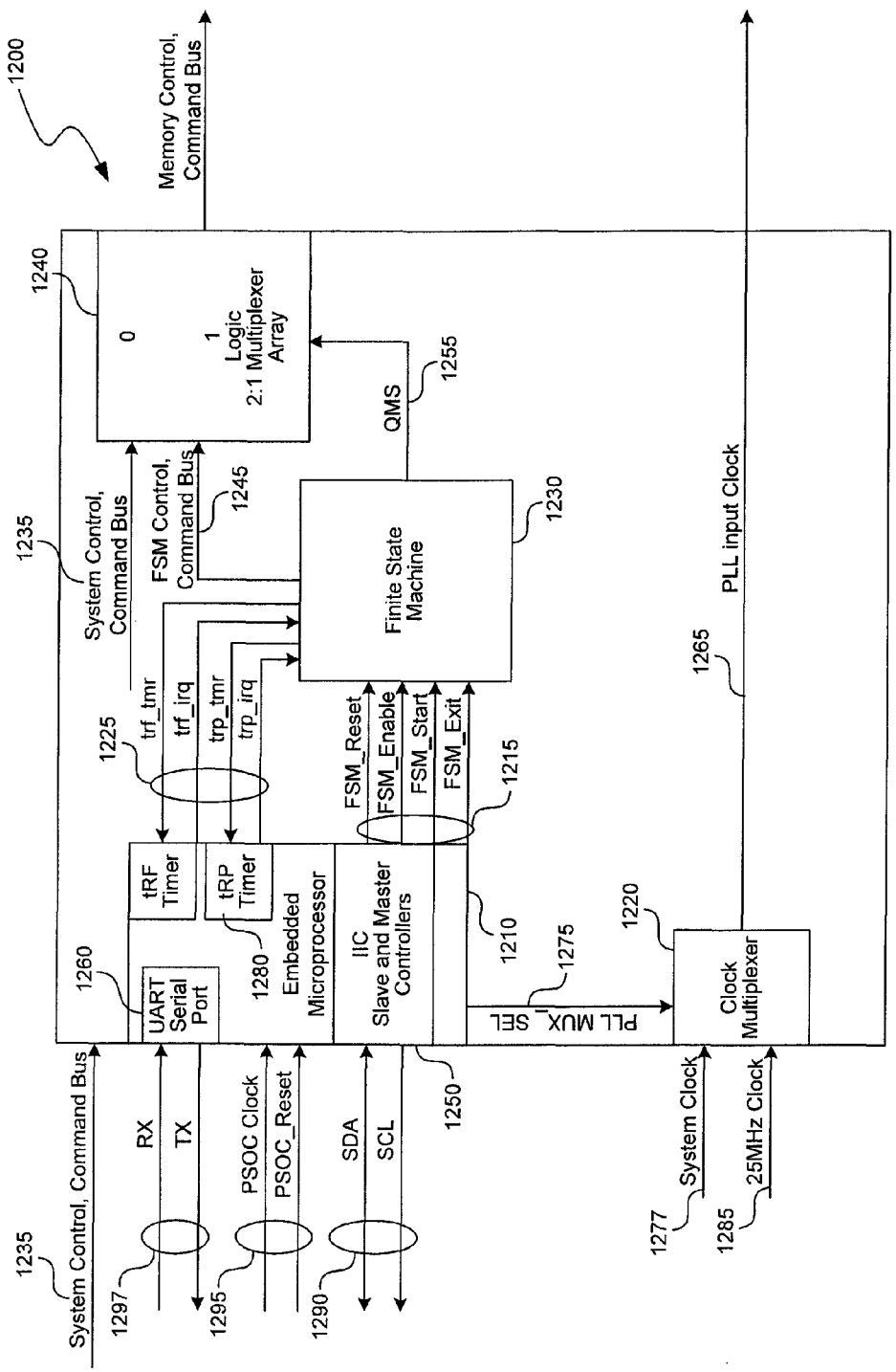
FIG. 12 illustrates an embodiment of a memory control system.

All of these components can be added up to a memory power control system—a system which controls a power supply and clock provided to a memory module, and thereby provides backup power and clocking when system power and system clocks fail. FIG. 12 illustrates an embodiment of a memory control system. System 1200 includes a PSOC, a finite state machine, a signal multiplexer and a clock multiplexer, and thereby receives and selects both clock and memory control and command bus signals.

PSOC 1210 is a processor system on a chip or similar processor, including a UART (Universal Asynchronous Receiver, Transmitter) serial port 1260, timers 1270 and 1280, and an IIC (I2C) controller 1250. Debug signals 1297 may interface with UART 1260, clock and reset signals 1295 are supplied to the PSOC, and system bus signals 1290 also interface with I2C controller 1250. This allows PSOC 1210 to produce finite state machine signals 1215 and timer signals 1225. These signals are used to control finite state machine 1230, which produces signals that control refresh of memory of a memory module. This also produces signal logic multiplexer select signal 1255, which selects an input for multiplexer 1240. Multiplexer 1240 is a logic signal multiplexer, accepting as input a set of system control and command bus signals 1235 and sets of finite state machine control and command bus signals 1245 to produce memory control and command bus signals During normal operation of the system with proper power and/or clock operation the system control and command bus input to signal logic multiplexer 1240 will be chosen by multiplexer select signal 1255. During either power interruption or system clock fault cycles the finite state machine control and command bus signals will be supplied as memory control and command bus signals through the other inputs of signal logic multiplexer 1240—and selected by multiplexer select signal 1255. A separate multiplex select signal 1275 selects as input either a system clock 1277 or a 25 MHz clock 1285 as inputs to clock multiplexer 1220 which provides as output a PLL input clock signal 1265. Clock multiplexer 1220 operates to not only select a clock output signal, but also to make sure that a switch from one clock signal to another clock signal does not cause edges to come so quickly as to simulate a clock rate higher than that specified for the system and memory module.

Figure 13:
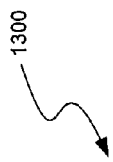
FIG. 13 illustrates an embodiment of a truth table.

While a general approach to a clock and power fault detection system provides much insight, a truth table for a specific implementation may also be useful. FIG. 13 illustrates an embodiment of a truth table. Truth table 1300 represents the values of signals to memory components of a DDR2 SDRAM memory module as would be generated to control the clock and power fault detection system and the actual memory (for write protection and refresh purposes).

Figure 14:
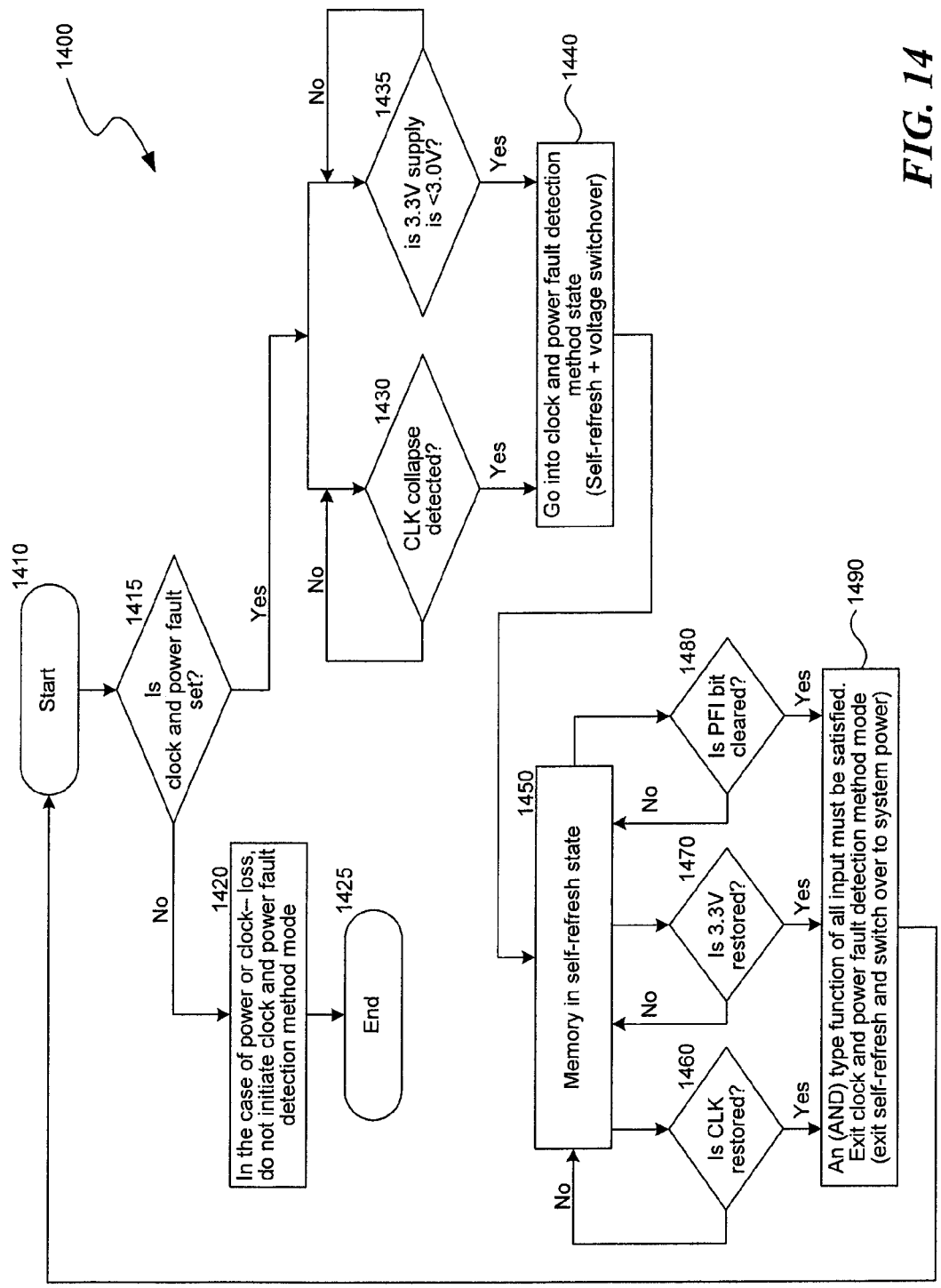
FIG. 14 illustrates an embodiment of a process of controlling power supply and clock signals to a memory system.

Whether the embodiments illustrated in the various figures are used, or alternative embodiments are used to provide clock and power fault detection for a memory module, various processes may be implemented to control such a clock and power fault detection system. FIG. 14 illustrates an embodiment of a process of controlling clock and power fault detection for a memory system. Process 1400 includes determining if clock and power fault detection is enabled, determining if power and clock signals are stable, providing clock and power fault detection, determining if the system power and clock signals have been restored, and operating the memory module normally. Process 1400 and other processes of this document are implemented as a set of modules, which may be process modules or operations, software modules with associated functions or effects, hardware modules designed to fulfill the process operations, or some combination of the various types of modules, for example. The modules of process 1400 and other processes described herein may be rearranged, such as in a parallel or serial fashion, and may be reordered, combined, or subdivided in various embodiments.

Process 1400 initiates at start module 1410. At module 1415, a determination is made as to whether a battery back bit or similar signal is set. If not, the system remains in a state at module 1420 where clock and power fault detection is not initiated if power or clock signals fail. This may be due to the system being manually powered down (a user turns it off) or the system not having enabled clock and power fault detection for whatever reason. At module 1425, the process stops with power going off.

If the clock and power fault detection bit is set, or some other signal is set to enable clock and power fault detection, then the process checks at module 1430 and 1435 whether a clock signal for the memory module has collapsed (module 1430) or whether the power supply is below a reference voltage (module 1435 and 3.0 V for a 3.3 V rail in one embodiment). If not, the process repeats the check—looping until something does happen. If one or both of the clock collapsing or the power supply diminishing occurs, then at module 1440, the process moves the memory module into a clock and power fault detection state. This may include setting a power fail interrupt bit in a register, indicating that a power failure was detected (or a clock failure) and the memory module assumed control.

This involves providing battery power and providing a battery-powered clock signal as well. At module 1450, the process also moves the memory module into a self-refresh state, where refresh is controlled by the memory module's on-board circuitry, rather than by system signals. The process then goes to checking whether the system has restored normal operation. At module 1460, a check is made as to whether the clock signal is restored. At module 1470, a check is made as to whether the power rail is restored. As illustrated, the 3.3 V power rail is checked, but other power rails, such as a 1.8 V power rail in some embodiments, may be checked instead. However, one may expect that a higher voltage power rail will droop before a lower voltage power rail in many system implementations.

Additionally, at module 1480, the module checks whether a bit has been cleared indicating the system is ready to take back control of the memory module. In one embodiment, this is a power fail interrupt bit. Typically, each of modules 1460, 1470 and 1480 must be satisfied—the power supply must be stable, the clock must be stable, and the power fail bit must be clear—before the memory module will release operation back to the system. This allows for screening of results caused by transient signals, for example. From module 1490, the system resumes control, and the process returns to its initial state at module 1410.

Figure 15:
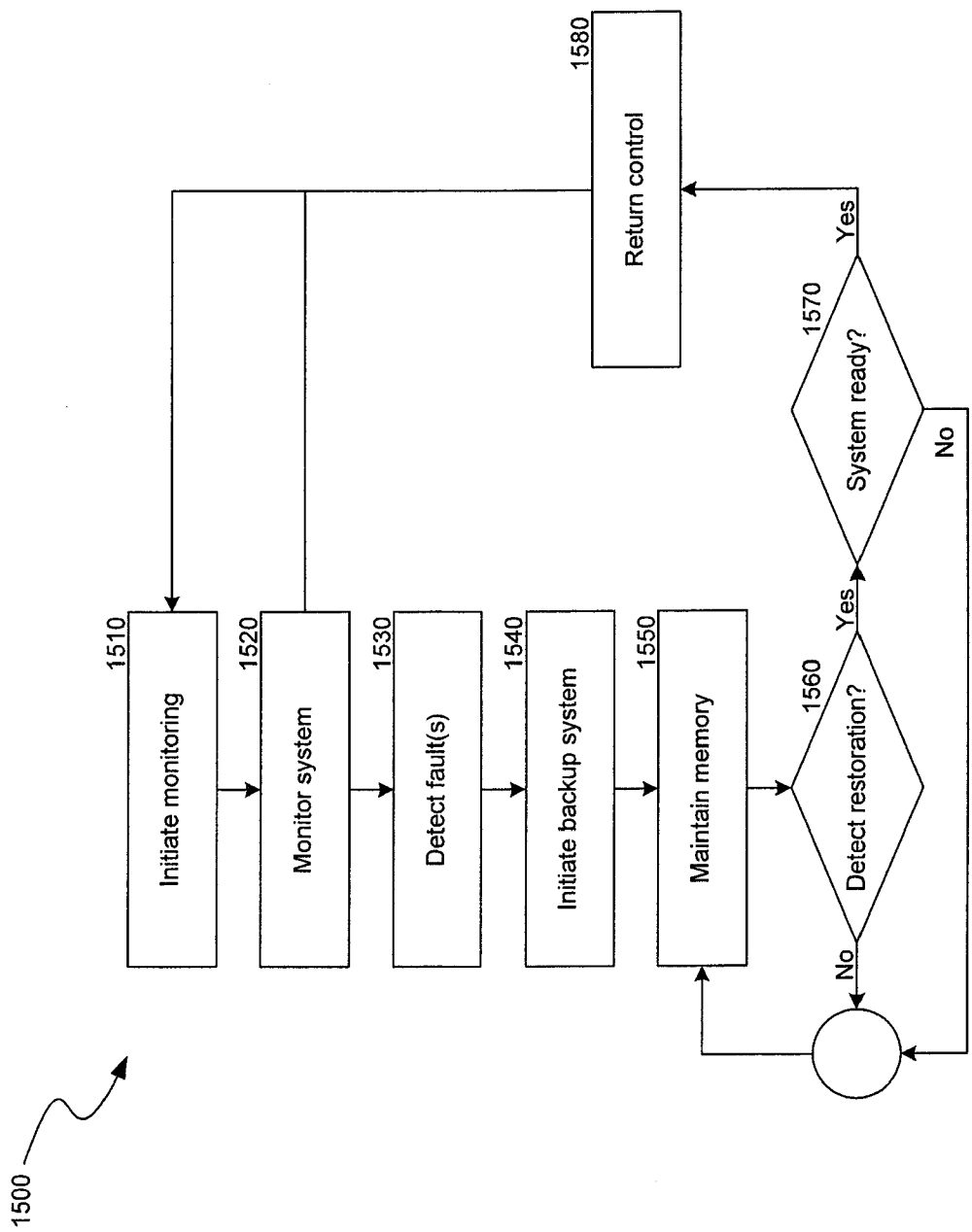
FIG. 15 illustrates an alternate embodiment of a process for monitoring clock and power for a memory module.

Another example of a similar process may provide further understanding of how one may provide power and clock monitoring for a memory module. FIG. 15 illustrates an alternate embodiment of a process for monitoring clock and power for a memory module. Process 1500 includes initiating monitoring, detecting a fault, initiating a backup system, maintaining memory, detecting potential restoration, checking whether a system is ready, and restoring control to the system.

In this embodiment, process 1500 initiates by initiating monitoring at module 1510. This may involve detecting that a bit is set enabling monitoring, for example. Alternatively, it may involve detecting that startup has completed in a system (e.g. a set time after a voltage level is detected for power), and automatically initiating monitoring at that point. At module 1520, the system is monitored, with power and clock signals checked for proper levels (power) or proper signals (clock). At module 1530, a fault is detected, whether in the clock or power signals (or both).

The backup system is initiated at module 1540, with the system taking over supply of the clock and power signals. Both signals are supplied to avoid confusion about what must be restored later—and because a fault in one signal is likely to lead to a fault in the other signal. Part of initiation may include asserting a bit in a register of the memory module indicating the module is in backup mode. With the backup system operating, the memory module is maintained at module 1550— power is supplied from a battery and a clock signal is generated to allow the module to refresh memory.

A determination is then made as to whether a restored signal is detected for the clock and power signals at module 1560. If either signal is not properly detected (fails to meet minimum criteria), the process moves back to module 1550 and maintains memory. If both signals are detected, the process then determines at module 1570 whether the system has signaled that it is ready to handle power and clock signaling. One signal that may be used is clearing the asserted bit of the memory module which was asserted to indicate backup mode at module 1540. Thus, the bit may be asserted for backup mode by the module and cleared for restoration by the system. If the system has not signaled that it is ready to handle power and clock signals, then the process moves back to module 1550. If the system has signaled that it is ready to handle power and clock signals, then control is returned to the system at module 1580, and the process returns to module 1510 (or potentially to module 1520).

One skilled in the art will appreciate that although specific examples and embodiments of the system and methods have been described for purposes of illustration, various modifications can be made without deviating from the present invention. For example, embodiments of the present invention may be applied to many different types of databases, systems and application programs. Moreover, features of one embodiment may be incorporated into other embodiments, even where those features are not described together in a single embodiment within the present document.

What is claimed is:

1. A system, comprising:
a voltage detection circuit;
a clock detection circuit;
a controller coupled to the voltage detection circuit and the clock detection circuit;
a memory control state machine coupled to the controller;
volatile memory coupled to the memory control state machine;
a battery; and
battery regulation circuitry coupled to the controller and the memory control state machine;
wherein the battery, battery regulation circuitry, volatile memory, memory control state machine, controller, clock detection circuit and voltage detection circuit are all collectively included in a unitary memory module; and
a power multiplexer coupled to receive a power supply of the battery and a power supply of a surrounding system and to provide a power supply to the volatile memory, the power multiplexer including:
a series of two drain coupled power MOSFETs coupled between the power supply of the battery and the power supply of the volatile memory; and
a series of two drain coupled power MOSFETs coupled between the power supply of the surrounding system and the power supply of the volatile memory.

2. The system of claim 1, wherein:
the controller is implemented as a processor system on a chip.

3. The system of claim 1, wherein:
the memory control state machine is implemented as a complex programmable logic device.

4. The system of claim 1, wherein:
the volatile memory is DDR2 SDRAM.

5. The system of claim 1, wherein:
the volatile memory is DDR SDRAM.

6. The system of claim 1, wherein:
the battery regulation circuitry includes clock generation circuitry.

7. The system of claim 1, wherein:
the battery regulation circuitry includes battery recharge circuitry.

8. The system of claim 1, wherein:
the battery regulation circuitry includes battery monitor circuitry.

9. A system, comprising:
a processor;
a bus coupled to the processor;
a memory control hub coupled to the bus;
a memory module coupled to the memory control hub, wherein the memory module includes:
a voltage detection circuit;
a clock detection circuit;
a controller coupled to the voltage detection circuit and the clock detection circuit;
a memory control state machine coupled to the controller;
volatile memory coupled to the memory control state machine;
a battery; and
battery regulation circuitry coupled to the battery. the controller and the memory control state machine;
a power multiplexer coupled to receive a power supply of the battery and a power supply of a surrounding system and to provide a power supply to the volatile memory;
a clock multiplexer coupled to receive a memory module-integrated battery backup clock and a system clock and to provide a memory module clock;
and wherein:
the controller is implemented as a processor system on a chip; and
the memory control state machine is implemented as a complex programmable logic device.

10. The system of claim 9, further comprising:
means for interfacing with peripheral components of the system.

11. A system comprising:
a voltage level detection circuit;
a clock signal detection circuit;
a memory control state machine;
a controller coupled to the voltage level detection circuit and the clock signal detection circuit and coupled with and receiving state information from a memory control state machine;

a volatile memory coupled to the controller;

a backup power supply and a backup power supply regulation circuit coupled to the controller;

a power multiplexer coupled to receive power from the backup power supply and power from a surrounding system and to provide power to the volatile memory; and the volatile memory, the controller, the memory control state machine, the backup power supply and backup power supply regulation circuit, are all collectively included in a unitary memory module;

the volatile memory, the controller, the voltage level detection circuit, the clock signal detection circuit, and the memory control state machine are configured for selective coupling with the backup power supply and the backup power supply regulation circuit; and the power multiplexer includes a series of two drain coupled power MOSFETs coupled between the backup power supply and the power supply of the volatile memory; and a series of two drain coupled power MOSFETs coupled between the power supply of the surrounding system and the power supply of the volatile memory.

12. The system of claim 11, wherein the system further includes the voltage level detection circuit and the clock signal detection circuit.

13. The system of claim 11, wherein the system further includes the memory control state machine coupled with the controller and providing the state information to the controller.

14. The system of claim 11, wherein the system further includes the voltage level detection circuit, the clock signal detection circuit, and the memory control state machine coupled with and providing the state information to the controller; and the backup power supply, backup power supply regulation circuit, volatile memory, memory control state machine, and controller are all collectively included in a unitary memory module.

15. The system of claim 14, wherein the volatile memory, the controller, the voltage level detection circuit, the clock signal detection circuit, and the memory control state machine are configured for selective coupling with the backup power supply and the backup power supply regulation circuit.

16. The system of claim 15, further comprising: a power multiplexer coupled to receive power from the backup power supply and power from a surrounding system and to provide power to the volatile memory.

17. The system of claim 14, further comprising:

a processor;

a bus coupled to the processor; and a memory control hub coupled to the bus; and wherein the unitary memory module is coupled to the memory control hub.

18. The system of claim 14, wherein the state machine is configured to operate the volatile memory in a power backup mode.

19. The system of claim 14, wherein:

the controller including the voltage level detection circuit and the clock signal detection circuit are operable to detect power fault and clock faults for the volatile memory, the power fault and clock fault detection including detecting an unacceptable variation in a voltage or clock signal to the volatile memory; and further comprising:

means for initiating a backup operation of the volatile memory when the unacceptable variation in a voltage or clock signal are detected, and configured to switch to the backup power supply integrated with the unitary memory module, and to switch to a clock signal produced by a component of the unitary memory module; and means for maintaining memory contents of the volatile memory including means for setting volatile memory components into a self-refresh state.

20. The system of claim 11, wherein the volatile memory comprises synchronous DRAM.

21. The system of claim 11, wherein the volatile memory comprises synchronous double data rate DRAM.

22. The system of claim 11, wherein: the backup power supply regulation circuit includes clock generation circuitry, backup power supply monitor circuitry; and backup power supply recharge circuitry.

* * * * *